US012288692B2

(12) United States Patent
Han et al.

(10) Patent No.: US 12,288,692 B2
(45) Date of Patent: Apr. 29, 2025

(54) METHOD OF FORMING A FET STRUCTURE BY SELECTIVE DEPOSITION OF FILM ON SOURCE/DRAIN CONTACT

(71) Applicant: TOKYO ELECTRON LIMITED, Tokyo (JP)

(72) Inventors: Yun Han, Albany, NY (US); Alok Ranjan, Austin, TX (US); Peter Ventzek, Austin, TX (US); Andrew Metz, Albany, NY (US); Hiroaki Niimi, Cohoes, NY (US)

(73) Assignee: TOKYO ELECTRON LIMITED, Tokyo (JP)

(*) Notice: Subject to any disclaimer, the term of this patent is extended or adjusted under 35 U.S.C. 154(b) by 394 days.

(21) Appl. No.: 17/721,014

(22) Filed: Apr. 14, 2022

(65) Prior Publication Data

US 2022/0344162 A1   Oct. 27, 2022

Related U.S. Application Data

(60) Provisional application No. 63/179,092, filed on Apr. 23, 2021.

(51) Int. Cl.
*H01L 21/285* (2006.01)
*H01L 21/02* (2006.01)
*H10D 30/01* (2025.01)
*H10D 30/62* (2025.01)
*H10D 64/01* (2025.01)
*H10D 64/62* (2025.01)

(52) U.S. Cl.
CPC .. *H01L 21/28518* (2013.01); *H01L 21/02057* (2013.01); *H10D 30/024* (2025.01); *H10D 30/62* (2025.01); *H10D 64/017* (2025.01); *H10D 64/62* (2025.01)

(58) Field of Classification Search
CPC .................................................. H01L 21/28518
See application file for complete search history.

(56) References Cited

U.S. PATENT DOCUMENTS 7,692,254 B2   4/2010   Anderson et al.
7,851,865 B2   12/2010  Anderson et al.
(Continued)

FOREIGN PATENT DOCUMENTS

KR   10-2020-0088519 A   7/2020

OTHER PUBLICATIONS

Bensahel, D., et al. "Kinetics Aspects of TiSi2 Deposition without Silicon Consumption." Applied Physics Letters, vol. 55, No. 15, 1989, pp. 1549-1551., https://doi.org/10.1063/1.102306.
(Continued)

*Primary Examiner* — Caleb E Henry
(74) *Attorney, Agent, or Firm* — Oblon, McClelland, Maier & Neustadt, L.L.P.

(57) ABSTRACT

A method for manufacturing a FET semiconductor structure includes providing a substrate comprising at least one source/drain contact of at least one FET, the at least one source/drain contact formed adjacent to a dummy gate of the at least one FET. A $TiSi_2$ film with C54 structure is selectively deposited directly on and fully covering the at least one source/drain contact relative to a vertical sidewall of a gate spacer between the at least one source/drain contact and the dummy gate. The dummy gate is replaced with a replacement metal gate.

20 Claims, 12 Drawing Sheets

(56) References Cited

U.S. PATENT DOCUMENTS

| | | | |
|---|---|---|---|
| 9,337,195 B2 | 5/2016 | Lin et al. | |
| 9,412,641 B1 | 8/2016 | Guo et al. | |
| 9,548,305 B2 | 1/2017 | Lin et al. | |
| 9,768,027 B2 | 9/2017 | Guo et al. | |
| 10,037,912 B2* | 7/2018 | Hsiao | H01L 21/76837 |
| 10,347,744 B1 | 7/2019 | Cheng et al. | |
| 10,607,841 B2 | 3/2020 | Srinivasan et al. | |
| 10,950,450 B2 | 3/2021 | Srinivasan et al. | |
| 2009/0020819 A1 | 1/2009 | Anderson et al. | |
| 2009/0101978 A1 | 4/2009 | Anderson et al. | |
| 2013/0240990 A1* | 9/2013 | Yin | H10D 30/0227 |
| | | | 438/300 |
| 2015/0171084 A1 | 6/2015 | Lin et al. | |
| 2015/0221884 A1* | 8/2015 | Han | H10K 10/484 |
| | | | 257/29 |
| 2016/0005824 A1* | 1/2016 | Lin | H01L 21/76855 |
| | | | 438/654 |
| 2016/0197079 A1 | 7/2016 | Lin et al. | |
| 2016/0254178 A1 | 9/2016 | Guo et al. | |
| 2016/0314976 A1 | 10/2016 | Guo et al. | |
| 2018/0166327 A1* | 6/2018 | Hsiao | H10D 84/0149 |
| 2018/0175172 A1 | 6/2018 | Chang et al. | |
| 2018/0315652 A1* | 11/2018 | Tsai | H01L 29/66545 |
| 2019/0189453 A1 | 6/2019 | Srinivasan et al. | |
| 2020/0227265 A1 | 7/2020 | Srinivasan et al. | |
| 2020/0279943 A1* | 9/2020 | Niimi | H01L 21/76843 |
| 2021/0202256 A1 | 7/2021 | Srinivasan et al. | |
| 2022/0109066 A1* | 4/2022 | Niimi | H01L 21/823878 |
| 2022/0344162 A1* | 10/2022 | Han | H10D 64/017 |
| 2023/0058186 A1* | 2/2023 | Clark | H01L 29/78696 |

OTHER PUBLICATIONS

Frank, Martin M., et al. "Titanium Silicide/Titanium Nitride Full Metal Gates for Dual-Channel Gate-First CMOS." IEEE Electron Device Letters, vol. 37, No. 2, 2016, pp. 150-153., https://doi.org/10.1109/led.2015.2513760.

Saito, Kunio, et al. "Selective Titanium Silicide Chemical Vapor Deposition with Surface Cleaning by Silane and Ohmic Contact Formation to Very Shallow Junctions." Journal of The Electrochemical Society, vol. 140, No. 2, 1993, pp. 513-518., https://doi.org/10.1149/1.2221078.

International Search Report and Written Opinion issued Aug. 11, 2022 in PCT/US2022/025363, 9 pages.

* cited by examiner

FIG. 5B

METHOD OF FORMING A FET STRUCTURE BY SELECTIVE DEPOSITION OF FILM ON SOURCE/DRAIN CONTACT

CROSS-REFERENCE TO RELATED APPLICATIONS

The present disclosure claims the benefit of U.S. Provisional Application No. 63/179,092 filed Apr. 23, 2021, which is incorporated herein by reference in its entirety.

TECHNICAL FIELD

The present invention generally relates to the field of semiconductors, and more particularly relates to a method of fabricating FET semiconductor devices.

BACKGROUND

Advancement in semiconductor technologies relies on continued improvement in manufacturing fabrication technology. Innovations in semiconductor technologies have resulted in the introduction of new types of structures, such as fin field-effect transistor (FinFET) devices and stacked structures (e.g., 3D NAND devices). The present inventors recognized that, in conventional FinFET process flow, source/drain damage, etch stop layer residual formed on the source/drain, and thermal budged limits for forming metal gates may result in poor quality contacts on the source/drains and uncontrolled variations in electrical performance of the devices. In addition, the inventors recognized that aggressive device scaling in 5 nm node and beyond, low contact resistance requirements using conventional integration schemes are not able to meet device performance requirement due to increasingly reduced contact area.

SUMMARY

The present disclosure relates to a semiconductor device, and a method of manufacturing a semiconductor device.

An aspect (1) provides a method for manufacturing a FET semiconductor structure, which includes providing a substrate including at least one source/drain contact of at least one FET, the at least one source/drain contact formed adjacent to a dummy gate of the at least one FET. A TiSi2 film with C54 structure is selectively deposited directly on and fully covering the at least one source/drain contact relative to a vertical sidewall of a gate spacer between the at least one source/drain contact and the dummy gate. The dummy gate is then replaced with a replacement metal gate.

An aspect (2) includes the method of aspect (1), wherein the selectively depositing of the TiSi2 film is performed before the replacing of the dummy gate with the replacement metal gate.

An aspect (3) includes the method of aspect (1), where the selectively depositing the TiSi2 film includes exposing the substrate to a process gas including a titanium-containing precursor gas and a silicon-containing precursor gas.

An aspect (4) includes the method of aspect (3), wherein the titanium-containing precursor gas includes TiCl4.

An aspect (5) includes the method of aspect (3), wherein the silicon-containing precursor gas includes at least one of SiH4, SiH2Cl2, SiHCl3, and SiCl4.

An aspect (6) includes the method of aspect (3), wherein the process gas includes TiCl4 and SiH4.

An aspect (7) includes the method of aspect (3), wherein the process gas further includes H2 gas.

An aspect (8) includes the method of aspect (3), further including maintaining gas pressure between about 1 mTorr and about 50 mTorr, or between about 5 mTorr and about 20 mTorr, and maintaining a substrate temperature between about 700° C. and about 800° C.

An aspect (9) includes the method of aspect (1), further including depositing, after depositing the TiSi2 film, an etch stop layer over the at least one source/drain contact, the dummy gate, the gate spacer, and the TiSi2 film.

An aspect (10) includes the method of aspect (9), further including depositing a dielectric over the etch stop layer.

An aspect (11) includes the method of aspect (1), further including cleaning the at least one source/drain contact using a cleaning process prior to the selectively depositing of the TiSi2 film.

An aspect (12) includes the method of aspect (11), wherein the cleaning process includes exposing the source/drain contact to a thermal H2 gas at a gas pressure between about 100 mTorr and about 700 mTorr, at a substrate temperature between about 600° C. and about 800° C., for a time period between about 10 sec and about 60 sec.

An aspect (13) includes the method of aspect (11), wherein the cleaning process includes exposing the source/drain contact to a thermal NH3 and HF gas at a gas pressure between about 1 Torr and about 3 Torr, at a substrate temperature between about 35° C. and about 100° C., for a time period between about 10 sec and about 60 sec.

An aspect (14) includes the method of aspect (11), wherein the cleaning process includes exposing the source/drain contact to a thermal NF3 and H2 gas at a gas pressure between about 1 Torr and about 3 Torr, at a substrate temperature between about 20° C. and about 100° C., for a time period between about 10 sec and about 60 sec.

An aspect (15) includes the method of aspect (1), wherein no anneal step is performed between the selectively depositing and the replacing steps.

An aspect (16) includes the method of aspect (1), further including an anneal step performed between the selectively depositing and the replacing steps.

Another aspect (17) includes a FET semiconductor device including a substrate including at least one source/drain contact of at least one FET, the at least one source/drain contact formed adjacent to a gate of the at least one FET and including an upper portion which is line-of-sight from a top of the substrate and a lower portion which is line-of-sight from a bottom of the substrate. A TiSi2 film with C54 structure conformally covers both the top and bottom portions of the at least one source/drain contact.

An aspect (18) includes the FET of aspect (17), wherein the source/drain contact includes epitaxial Si.

An aspect (19) includes the FET of aspect (17), further including a gate spacer between the at least one source/drain contact and the gate.

An aspect (20) includes the FET of aspect (19), wherein the gate spacer includes SiN.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION OF ILLUSTRATIVE EMBODIMENTS

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present invention will be described in terms of various illustrative example processes for fabricating FET semiconductor structures on a circuit supporting substrate. These fabrication processes may be used to fabricate planar FET semiconductor devices, FinFET semiconductor devices, or both types of semiconductor devices, on a circuit supporting substrate.

Figure 1:
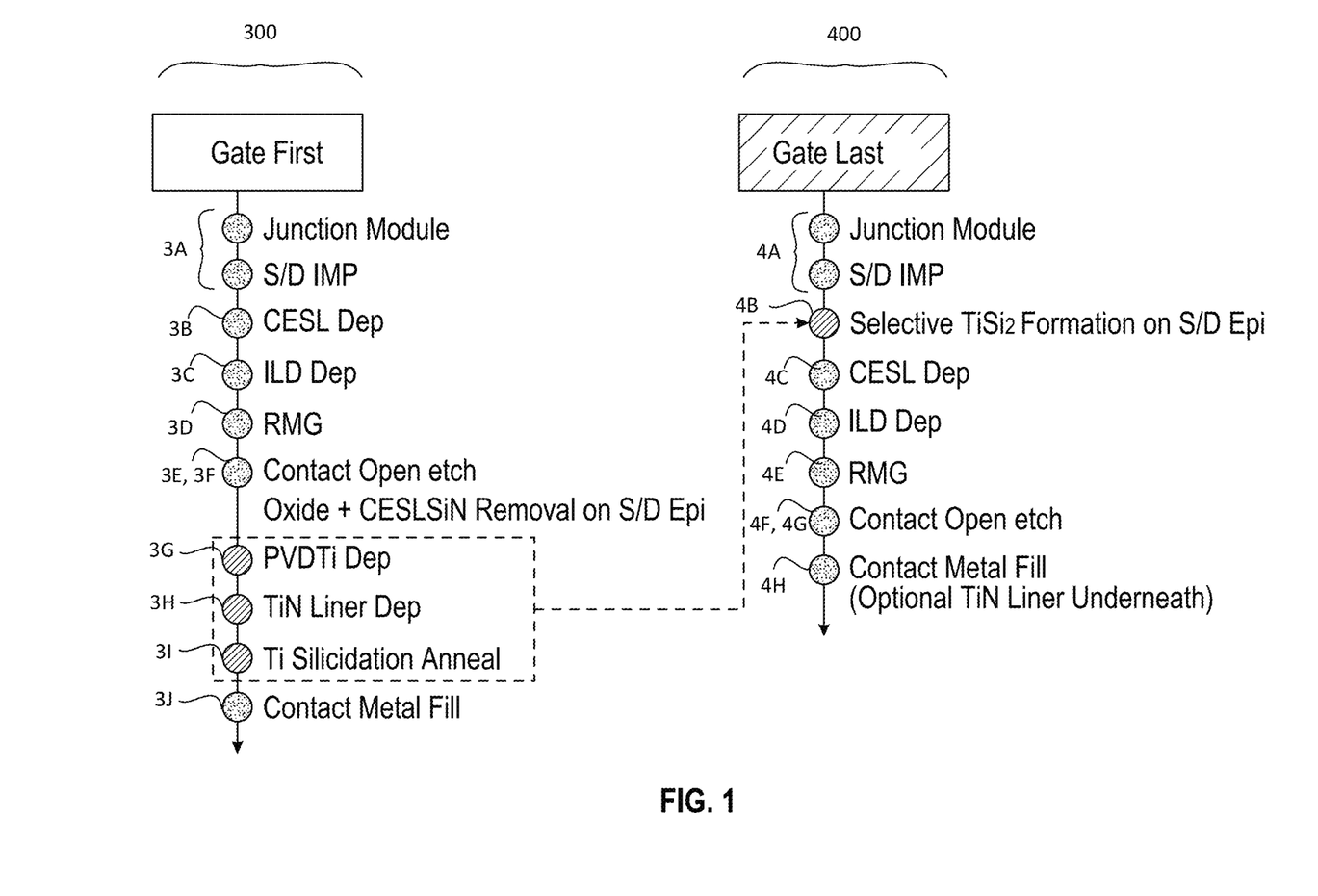
FIG. 1 shows a conventional method for FinFET manufacturing compared to a method for FinFET manufacturing in accordance with an example embodiment of the present disclosure.

FIG. 1 shows process flows for conventional gate first FinFET manufacturing process 300 in comparison to a method for FinFET manufacturing 400 according to an embodiment of the invention. The conventional FinFET manufacturing is represented by flow steps 3A-3J which includes the formation of a replacement metal gate (RMG) in step 3D before forming a titanium silicide ($TiSi_2$) film on a source/drain contact in steps 3G-3I. Forming the $TiSi_2$ film is achieved by non-selective physical vapor deposition (PVD) of Ti metal on epitaxial Si of the source/drain contact in step 3G, followed by deposition of a TiN liner on the Ti metal in step 3H, and thereafter in step 3I an anneal is performed that reacts the Ti metal with Si in the source/drain contact to form a low-resisitivity titanium silicide (i.e., $TiSi_2$ with C54 structure). The Ti metal PVD is a line-of-sight deposition method and the Ti metal deposition can therefore not be used for wrap-around deposition on the source/drain contacts. Additional details related to the conventional FinFET will be discussed with respect to correspondingly numbered FIGS. 3A-3J.

The conventional FinFET manufacturing method has a number of potentially problematic issues that can lead to poor quality of $TiSi_2$ formation, such as residual contact etch stop layer (CESL) SiN, damaged epitaxial Si after reactive-ion etching (ME), reduced metal contact area, and partial formation of $TiSi_2$ by thermal anneal due to thermal budget of (WF) materials.

In contrast, embodiments of the disclosure provide a method of FinFET manufacturing where the RMG is formed after forming a titanium silicide film on a source/drain contact as shown by example process steps 4A-4H in FIG. 1. Additional details related to these steps will be discussed with respect to correspondingly numbered FIGS. 4A-4H. The titanium silicide may be deposited as a fully formed $TiSi_2$ film with C54 structure, thereby making a subsequent anneal optional. The titanium silicide may, for example, be selectively deposited on the source/drain contact by exposing the substrate to a process gas containing a titanium-containing precursor gas and a silicon-containing precursor gas. For example, the process gas can contain $SiH_4$ and $TiCl_4$.

Embodiments of the disclosure, provide a one-step wrap-around $TiSi_2$ film formation on source/drain contacts with significantly improved interface quality compared to conventional methods. The $TiSi_2$ film is fully formed with low electrical resistance and does not rely on Si diffusion from the source/drain contact. The method enables a novel integrated process flow which eliminates damage to epitaxial Si source/drain contacts, eliminates formation of an etch stop layer residual formed on the source/drain contacts, and reduces source/drain contact resistance.

Figure 2:
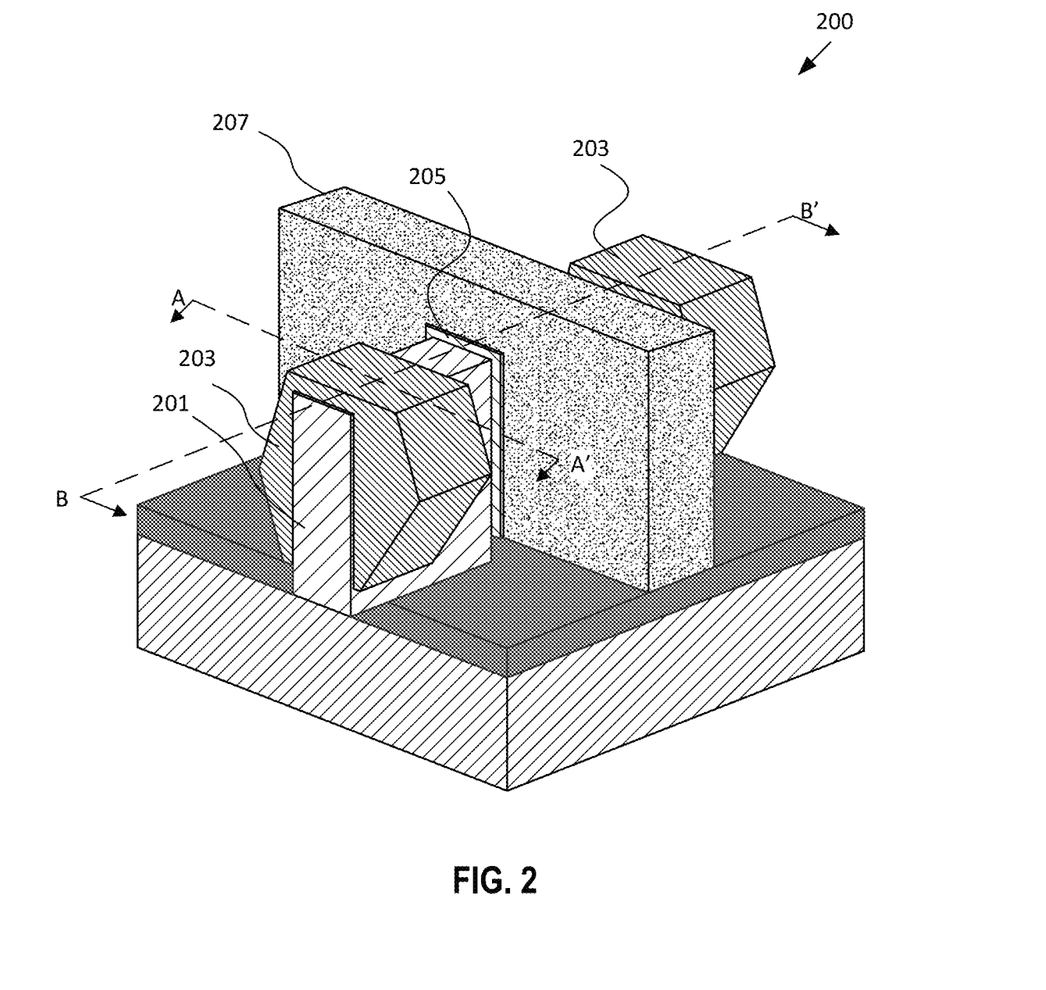
FIG. 2 shows a schematic of a FinFET structure in accordance with an example embodiment of the present disclosure.

FIG. 2 schematically shows a FinFET. The FinFET includes a fin 201, epitaxial Si source/drain (S/D) contacts 203 on the fin 201, a gate dielectric 205 over the fin 201, and a metal gate 207 over the gate dielectric 205. A fin cut A-A' is indicated across the epitaxial Si source/drain 203 and the fin 201, and a gate cut B-B' is indicated along the length of the fin 201. Similar fin cuts and a gate cuts across a FinFET are shown in FIGS. 3A-3J and 4A-4H, discussed later herein.

Figure 3A:
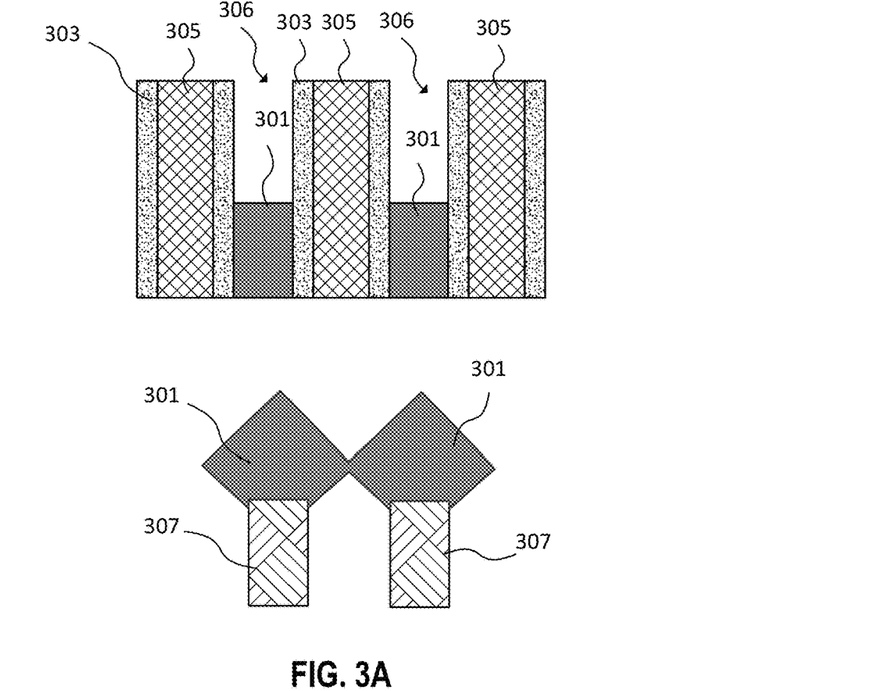
FIGS. 3A, 3B, 3C, 3D, 3E, 3F, 3G, 3H, 3I and 3J illustrate various process steps for a conventional method to manufacture a FinFET.

FIGS. 3A-3J schematically show a conventional method of forming a FinFET according a gate first process. Each of FIGS. 3A-3J includes a top illustration of a gate cut view such as B-B' in FIG. 2, and a bottom illustration of a fin cut view such as A-A' of FIG. 2. Unlike the FinFET in FIG. 2, the gate cut views of FIGS. 3A-3J show three adjacent gates, and the fin cut views show two adjacent S/D contacts. FIG. 3A shows S/D contacts 301, gate spacers 303, dummy gates 305, contact holes 306, and fins 307. For example, the S/D contact 301 can include epitaxial Si, the fin 307 can include Si, the gate spacer 303 can include SiN, and/or the dummy gate 305 can include poly Si. While the fin cut views of FIGS. 3A-3J show S/D contacts 301 physically connected to each other to form a common S/D for a two fin device, the S/D contacts 301 may be separated from each other and associated with respective single fin devices.

Figure 3B:
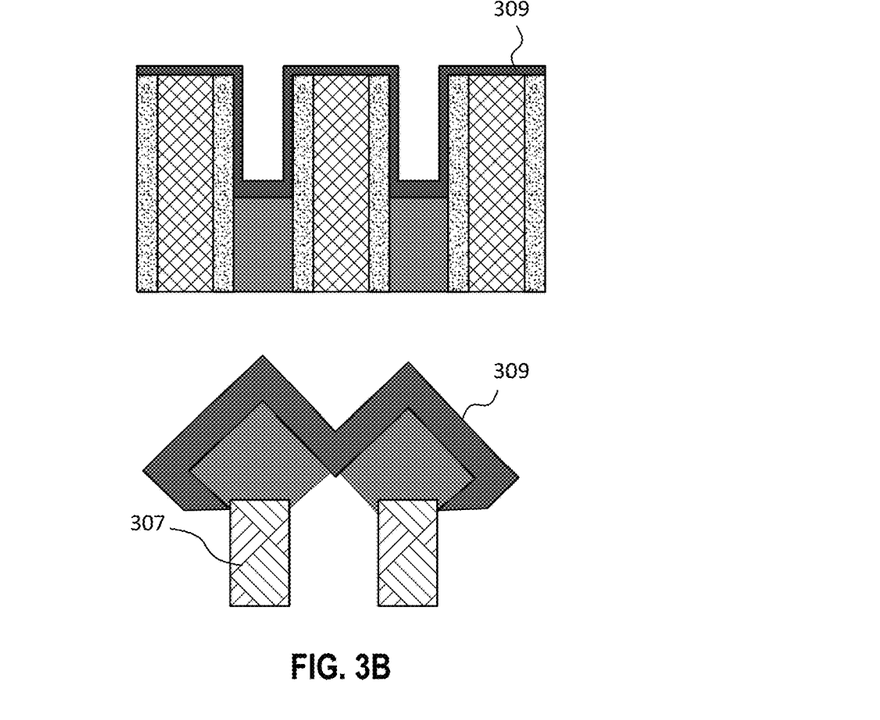

FIG. 3B shows the FinFET following deposition of a conformal etch stop layer (ESL) 309. As seen, ESL 309 is deposited on downward facing surfaces of the S/D contacts 301 except for the middle region which is not exposed to the deposition gas due to physical connection of the S/D contacts 301 into a common S/D as noted above. With embodiments including a single S/D contact, or adjacent S/D contacts physically separated from each other, the ESL 309 is deposited on all downward facing surfaces exposed to the gas environment for depositing the ESL. In one example, the ESL 309 can contain SiN.

Figure 3C:
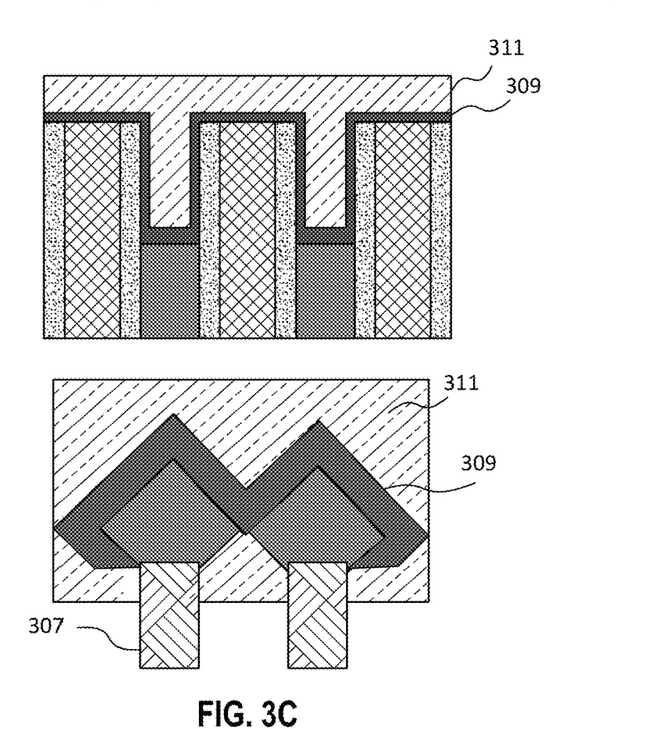

FIG. 3C shows the FinFET following a blanket deposition of a dielectric 311 layer over the ESL 309 and which fills the contact holes 306.

Figure 3D:
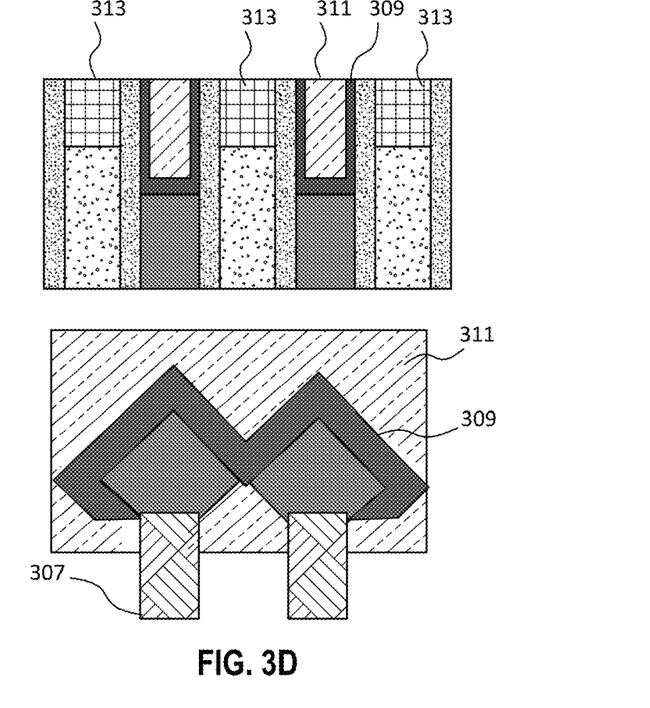

FIG. 3D shows the FinFET following planarization and the replacement of the dummy gate 305 with a replacement metal gate (RMG) 313.

Figure 3E:
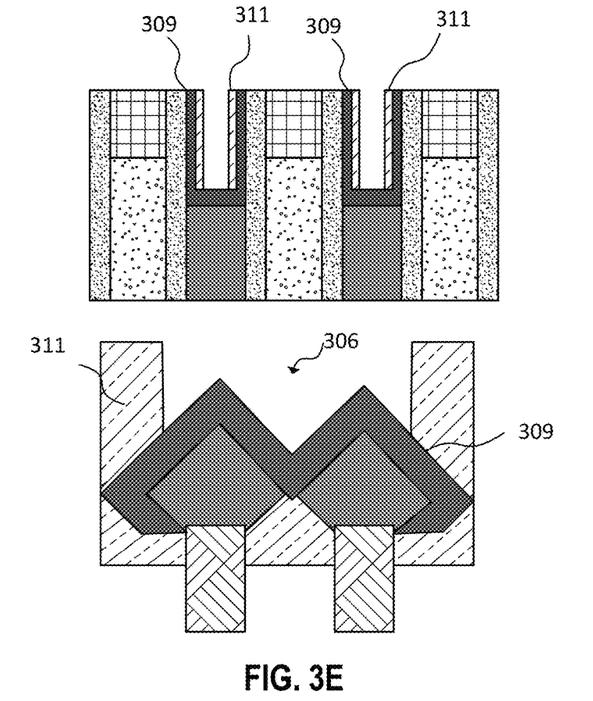

FIG. 3E shows the FinFET following an anisotropic oxide etch that exposes the ESL 309 in the contact holes 306.

Figure 3F:
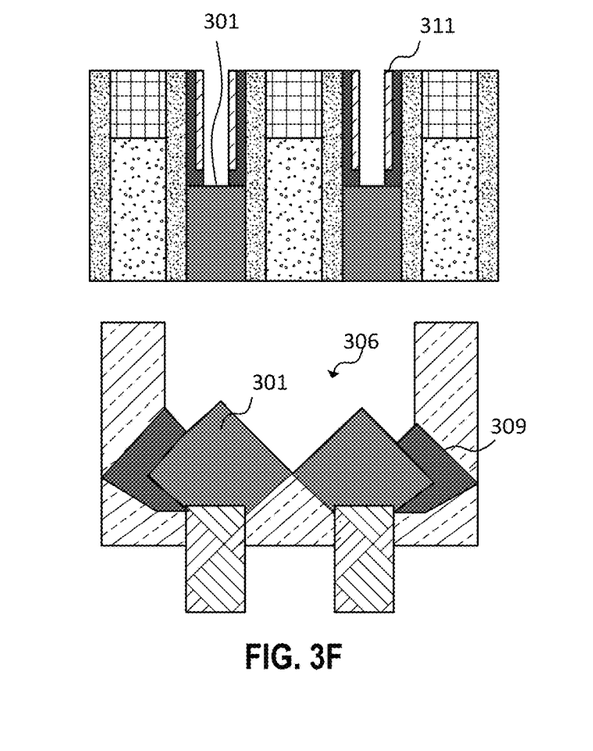

FIG. 3F shows the FinFET following an anisotropic nitride etch that exposes the S/D contact 301 in the contact holes 306.

Figure 3G:
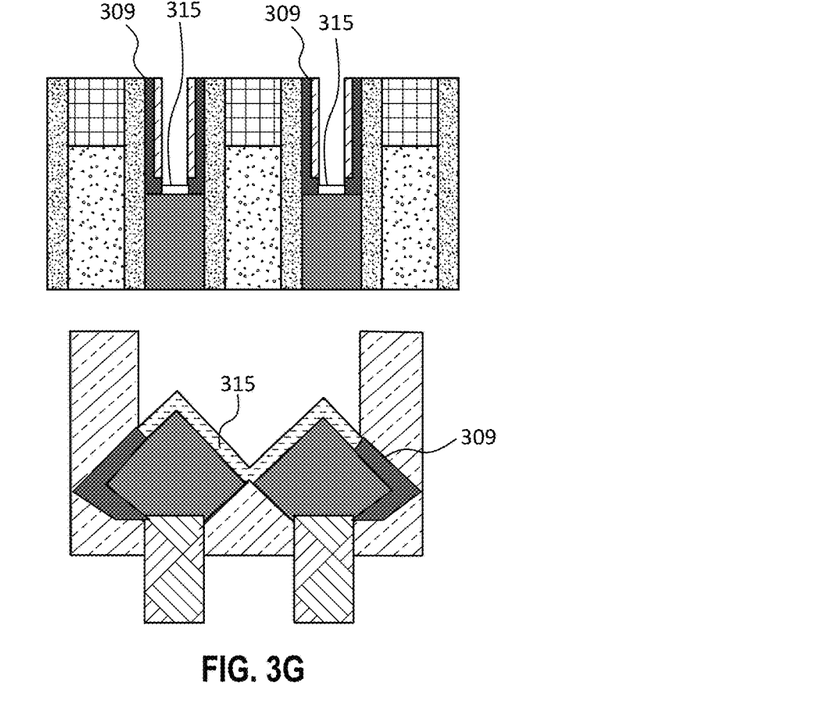

FIG. 3G shows the FinFET following deposition of Ti metal 315 in the contact holes 306 by PVD which deposits Ti metal 315 only on the S/D contact 301 and not on the sidewall.

Figure 3H:
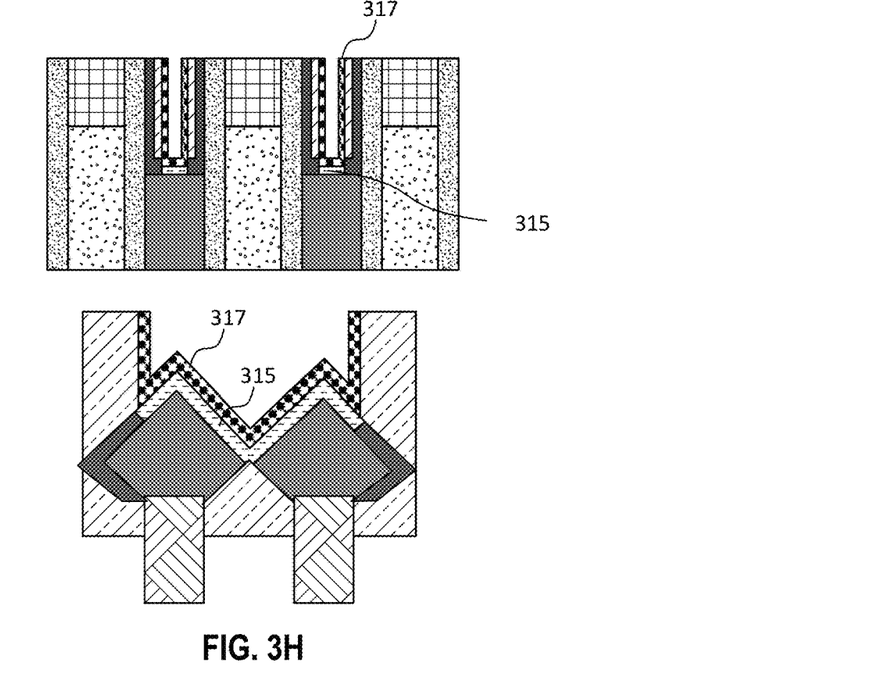

FIG. 3H shows the FinFET following conformal deposition of a TiN layer 317 in the contact holes 306

Figure 3I:
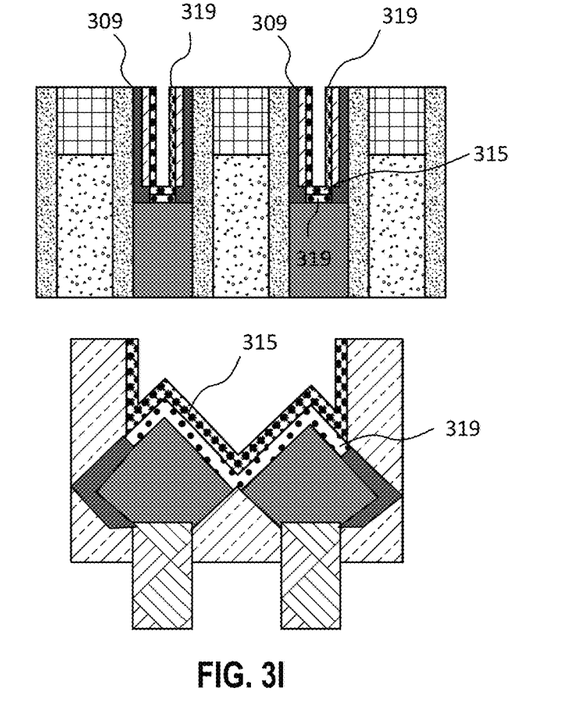

FIG. 3I shows the FinFET following an annealing that forms a $TiSi_2$ layer 319 by reaction of the Ti metal 315 and Si in the epitaxial Si S/D contact 301.

Figure 3J:
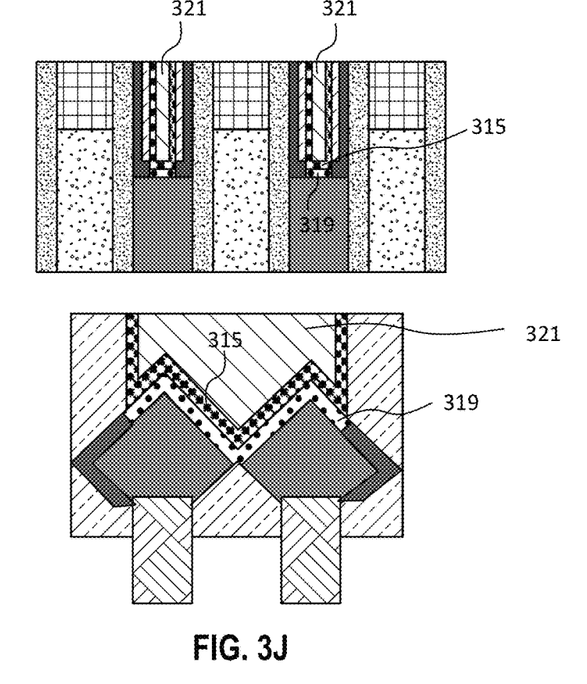

FIG. 3J shows the FinFET following filling of the contact hole 306 with a metal 321.

Figure 4A:
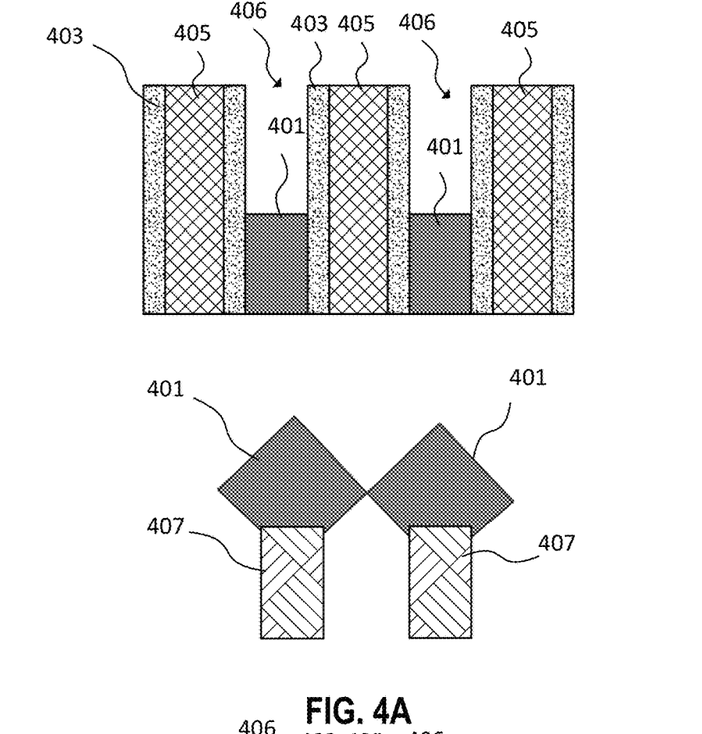
FIGS. 4A, 4B, 4C, 4D, 4E, 4F, 4G, and 4H illustrate various process steps for a new method to manufacture a FinFET in accordance with an example embodiment of the present disclosure.

FIGS. 4A-4H schematically show a method of forming a FinFET according a gate last process according to an embodiment of the present disclosure. Each of FIGS. 4A-4H includes a top illustration of a gate cut view such as B-B' in FIG. 2, and a bottom illustration of a fin cut view such as A-A' of FIG. 2. Unlike the FinFET in FIG. 2, the gate cut views of FIGS. 4A-4J show three adjacent gates, and the fin cut views show two adjacent S/D contacts. FIG. 4A shows S/D contacts 401, gate spacers 403, dummy gates 405, contact holes 406, and fins 407. For example, the S/D contact 401 can include epitaxial Si, the fin 407 can include Si, the gate spacer 403 can include SiN, and/or the dummy gate 405 can include poly Si. While the fin cut views of FIGS. 4A-4H show S/D contacts 401 physically connected to each other to form a common S/D for a two fin device, the S/D contacts 401 may be separated for from each other and associated with respective single fin devices.

A surface of the epitaxial Si S/D contact 401 may be cleaned of any $SiO_2$ by using a cleaning process. A cleaning process may be used that provides good selectivity between $SiO_2$ and a SiN gate spacer 403. The cleaning process facilitates good subsequent deposition of a $TiSi_2$ film on the epitaxial Si. In one example, the cleaning process can include a thermal $H_2$ gas exposure at a gas pressure between about 600 mTorr and about 700 mTorr, a substrate temperature between about 700° C. and about 800° C., and a time period between about 10 sec and about 30 sec. In another example, the cleaning process can include a thermal $H_2$ gas exposure at a gas pressure between about 100 mTorr and about 700 mTorr, a substrate temperature between about 600° C. and about 800° C., and a time period between about 10 sec and about 60 sec. In another example, the cleaning process can include a thermal $NH_3$ and HF gas exposure at a gas pressure between about 1 Torr and about 3 Torr, a substrate temperature between about 35° C. and about 100° C., and a time period between about 10 sec and about 30 sec, or alternatively a time period between about 10 sec and about 60 sec. In yet another example, the cleaning process can include a thermal $NF_3$ and $H_2$ gas exposure at a gas pressure between about 1 Torr and about 3 Torr, a substrate temperature between about 20° C. and about 100° C., and a time period between about 10 sec and about 30 sec, or alternatively a time period between about 10 sec and about 60 sec.

Figure 4B:
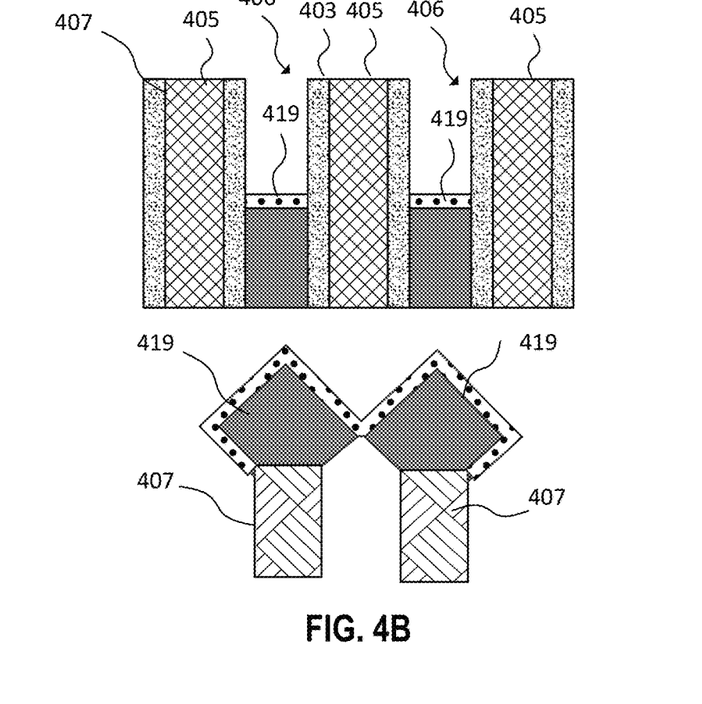

FIG. 4B shows the FinFET following selective deposition of a $TiSi_2$ film 409 with C54 structure directly on and fully covering the S/D contact 401 relative to a vertical sidewall of the gate spacer 403 between the S/D contact 401 and the dummy gate 405. Importantly, the $TiS_2$ film 419 may be deposited as a fully formed $TiSi_2$ film 419 with C54 structure, thereby making a subsequent anneal optional. $TiSi_2$ film 419 wraps-around the S/D contact 401, including lower surfaces that are not line-of-sight from above the substrate. The selectively deposition can include exposing the substrate to a process gas containing a titanium-containing precursor gas and a silicon-containing precursor gas. For example, the titanium-containing precursor gas can include $TiCl_4$. For example, the silicon-containing precursor gas can include $SiH_4$, $SiH_2Cl_2$, $SiHCl_3$, or $SiCl_4$. In one example, the process gas can contain $SiH_4$ and $TiCl_4$. The process gas may further include $H_2$ gas. The gas pressure can, for example, be between about 1 mTorr and about 50 mTorr, or between about 5 mTorr and about 20 mTorr. A substrate temperature can, for example, be between about 700° C. and about 800° C.

Figure 4C:
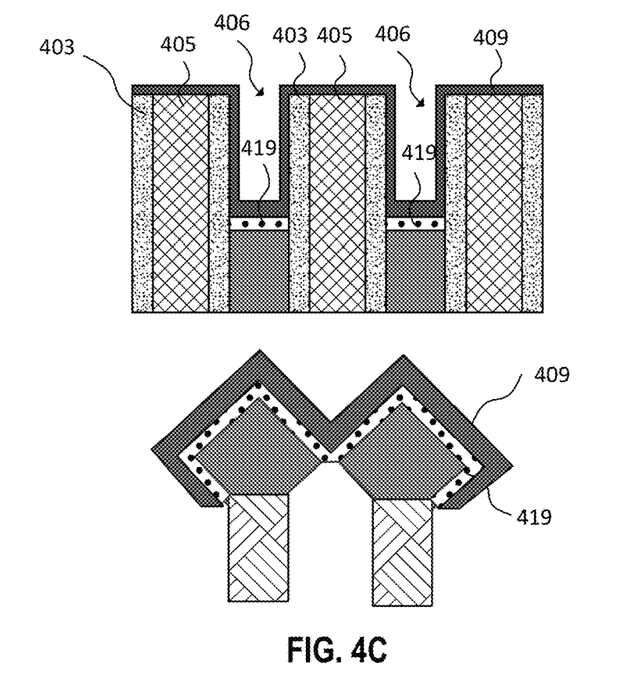

FIG. 4C shows the FinFET following deposition of a conformal etch stop layer (ESL) 409. As seen, ESL 409 is deposited on downward facing surfaces of the S/D contacts 401 except for the middle region which is not exposed to the deposition gas due to physical connection of the S/D contacts 401 into a common S/D as noted above. With embodiments including a single S/D contact, or adjacent S/D contacts physically separated from each other, the ESL 409 is deposited on all downward facing surfaces exposed to the gas environment for depositing the ESL. In one example, the ESL 409 can contain SiN.

Figure 4D:
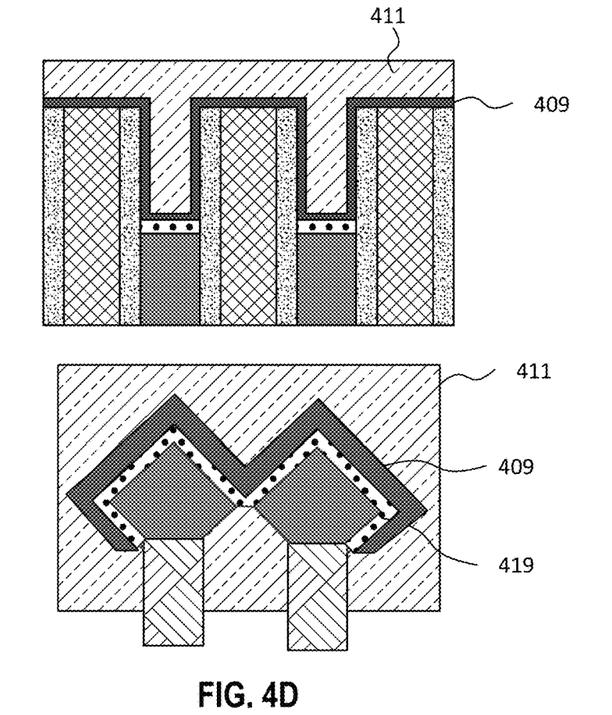

FIG. 4D shows the FinFET following a blanket deposition of a dielectric 411 layer that fills the contact holes 406.

Figure 4E:
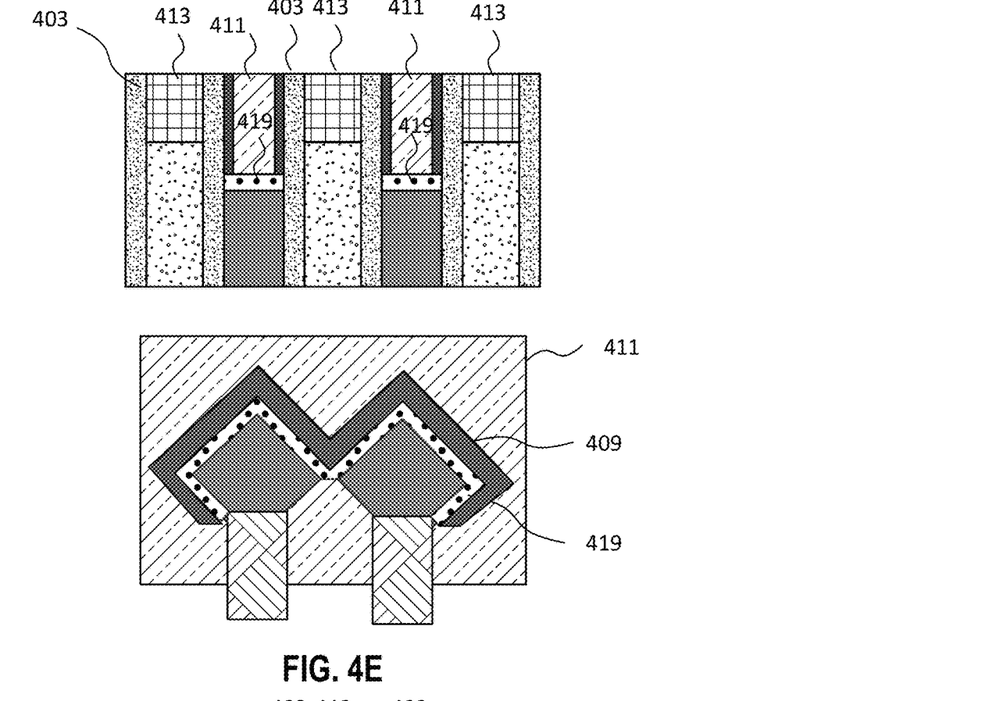

FIG. 4E shows the FinFET following the replacement of the dummy gate 405 with a replacement metal gate (RMG) 413. In one example, the replacement may be performed by planarizing the structure down to the ESL 409 using chemical mechanical planarization (CMP), forming a patterned mask that exposes the dummy gate 405, removing the dummy gate 405 (e.g., poly Si) by a plasma etching process, thereby forming a recessed feature, depositing a conformal high-k dielectric layer (not shown) in the recessed feature, partially filling the recessed feature with tungsten (W) metal, and filling the remaining portion of the recessed feature with SiN.

Figure 4F:
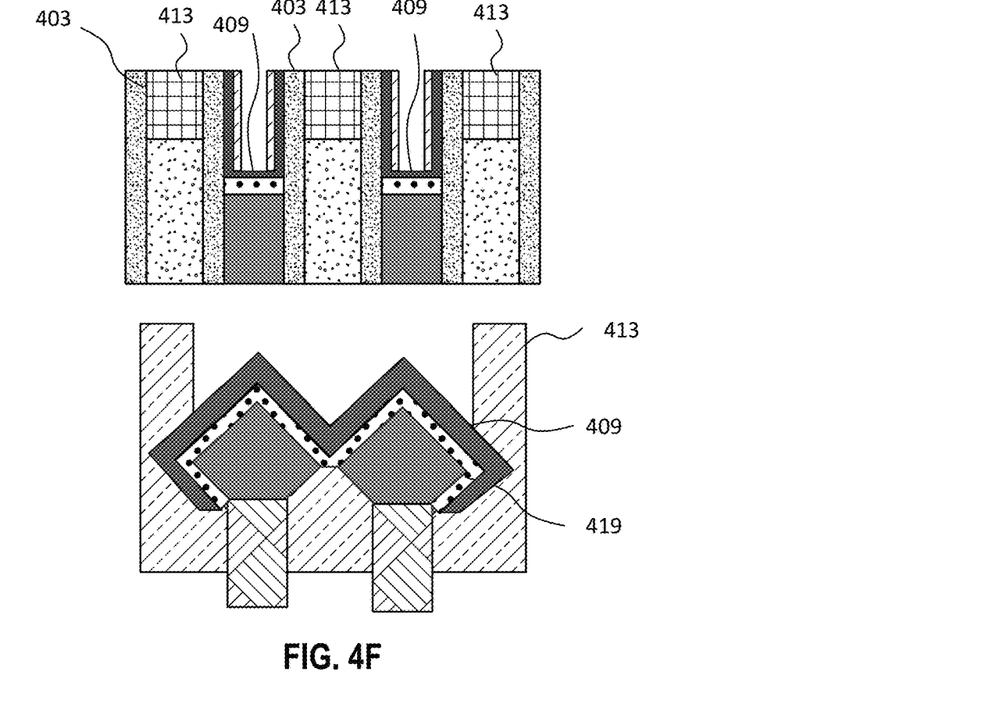

FIG. 4F shows the FinFET following an anisotropic etch that exposes the ESL 409 in the contact holes 406.

Figure 4G:
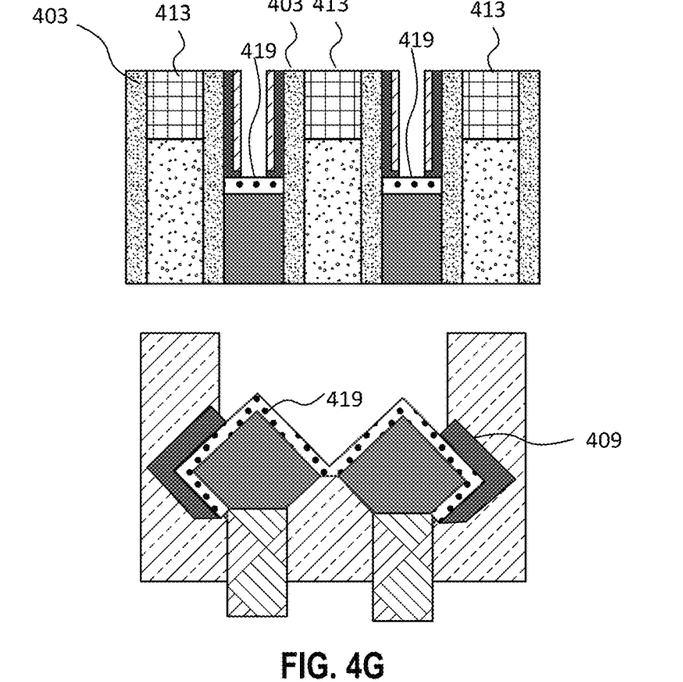

FIG. 4G shows the FinFET following an anisotropic etch that exposes the $TiSi_2$ film 419 on the S/D contact 401 in the contact holes 406.

Figure 4H:
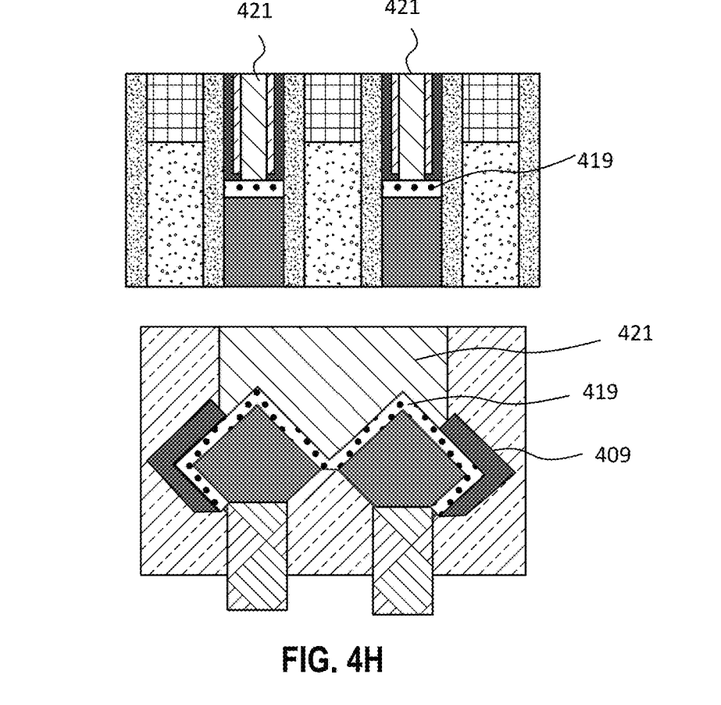

FIG. 4H shows the FinFET following filling of the contact hole 406 with a metal 415. As can be seen, since the dummy gate 405 is replaced with the RMG 414 after the $TiSi_2$ film 409 has been deposited, the FinFET has TiSi$_2$ film 409 deposited around the entire perimeter of the S/D contact 401 (apart from the portion of the perimeter in contact with the fin 407). This direct formation of the TiSi$_2$ film 409 on the S/D contact 401 can improve interface quality, reduce contact resistance from the increased contact area, and mitigate thermal budget concerns due to the high thermal stability of the TiSi$_2$ film 409.

Therefore, it can be appreciated that the devices discussed herein, and variations thereof, can be viewed as a system. In one embodiment, a FET semiconductor device comprises: a substrate containing at least one source/drain contact of at least one FET, the at least one source/drain contact formed adjacent to a gate of the at least one FET; and a TiSi2 film with C54 structure directly on and fully covering the at least one source/drain contact relative to a vertical sidewall of a gate spacer between the at least one source/drain contact and the gate. One example of such a system is shown in FIG. 4H.

Figure 5A:
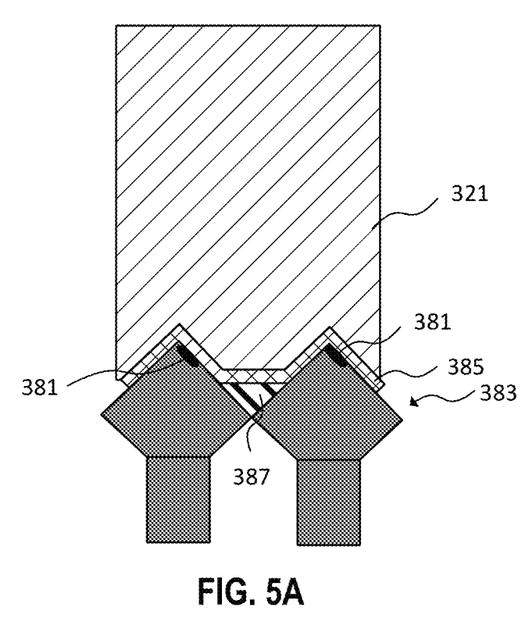
FIGS. 5A and 5B illustrate a comparison of a conventional FinFET structure to a FinFET structure in accordance with an example embodiment of the present disclosure.
Figure 5B:
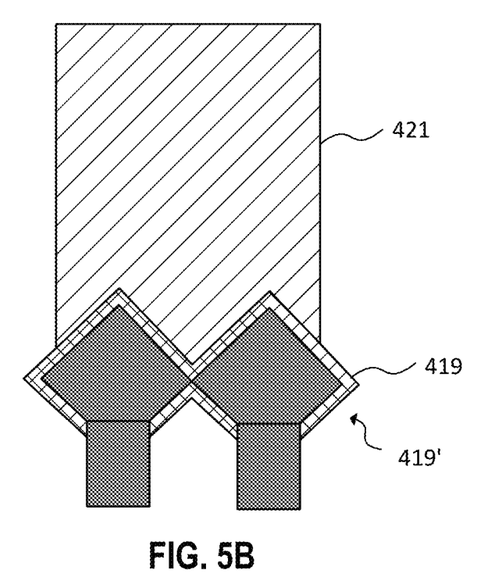

FIG. 5A is a schematic representation of the structure resulting from a conventional FinFET manufacturing method. As seen, the structure includes residual contact etch stop layer (CESL) SiN 387, and damaged epitaxial Si 381 after reactive-ion etching (RIE) process. The TiSi$_2$ layer 385 is only partially formed due to low thermal budgets for (WF) materials. Further, TiSi$_2$ has a reduced metal contact area 383. FIG. 5B is a schematic representation of the structure resulting from a FinFET manufacturing method according to embodiments disclosed herein where the RMG is formed after forming a titanium silicide film on a source/drain contact as discussed in FIGS. 4A-4H. As seen, the TiSi$_2$ film 419 is fully formed with a lower portion 419' that is not line of sight from the top of the substrate. This enables a low electrical resistance and does not rely on Si diffusion from the source/drain contact. Further, the disclosed method eliminates damage to epitaxial Si source/drain contacts, eliminates formation of an etch stop layer residual formed on the source/drain contacts, and reduces source/drain contact resistance.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for manufacturing a FET semiconductor structure, the method comprising:
   providing a substrate comprising at least one source/drain contact of at least one FET, the at least one source/drain contact formed adjacent to a dummy gate of the at least one FET;
   selectively depositing a TiSi$_2$ film with C54 structure directly on and fully covering the at least one source/drain contact relative to a vertical sidewall of a gate spacer between the at least one source/drain contact and the dummy gate; and
   replacing the dummy gate with a replacement metal gate, wherein the selectively depositing the TiSi$_2$ film comprises exposing the substrate to a process gas containing a titanium-containing precursor gas and a silicon-containing precursor gas.

2. The method of claim 1, wherein the selectively depositing the TiSi$_2$ film is performed before the replacing of the dummy gate with the replacement metal gate.

3. The method of claim 1, wherein the titanium-containing precursor gas comprises TiCl$_4$.

4. The method of claim 1, wherein the silicon-containing precursor gas comprises at least one of SiH$_4$, SiH$_2$Cl$_2$, SiHCl$_3$, and SiCl$_4$.

5. The method of claim 1, wherein the process gas comprises TiCl$_4$ and SiH$_4$.

6. The method of claim 1, wherein the process gas further comprises H$_2$ gas.

7. The method of claim 1, further comprising:
   maintaining gas pressure between about 1 mTorr and about 50 mTorr; and
   maintaining a substrate temperature between about 700° C. and about 800° C.

8. The method of claim 1, further comprising depositing, after depositing the TiSi$_2$ film, an etch stop layer over the at least one source/drain contact, the dummy gate, the gate spacer, and the TiSi$_2$ film.

9. The method of claim 8, further comprising depositing a dielectric over the etch stop layer.

10. The method of claim 1, further comprising cleaning the at least one source/drain contact using a cleaning process prior to the selectively depositing of the TiSi$_2$ film.

11. The method of claim 10, wherein the cleaning process comprises exposing the source/drain contact to a thermal H2 gas at a gas pressure between about 100 mTorr and about 700 mTorr, at a substrate temperature between about 600° C. and about 800° C., for a time period between about 10 sec and about 60 sec.

12. The method of claim 10, wherein the cleaning process comprises exposing the source/drain contact to a thermal NH3 and HF gas at a gas pressure between about 1 Torr and about 3 Torr, at a substrate temperature between about 35° C. and about 100° C., for a time period between about 10 sec and about 60 sec.

13. The method of claim 10, wherein the cleaning process comprises exposing the source/drain contact to a thermal NF3 and H2 gas at a gas pressure between about 1 Torr and about 3 Torr, at a substrate temperature between about 20° C. and about 100° C., for a time period between about 10 sec and about 60 sec.

14. The method of claim 1, wherein no anneal step is performed between the selectively depositing and the replacing steps.

15. The method of claim 1, further comprising an anneal step performed between the selectively depositing and the replacing steps.

16. A method for manufacturing a FET semiconductor structure, the method comprising:
    providing a substrate comprising at least one source/drain contact of at least one FET, the at least one source/drain contact formed adjacent to a dummy gate of the at least one FET;
    selectively depositing a $TiSi_2$ film with C54 structure directly on and fully covering the at least one source/drain contact relative to a vertical sidewall of a gate spacer between the at least one source/drain contact and the dummy gate;
    replacing the dummy gate with a replacement metal gate; and
    cleaning the at least one source/drain contact using a cleaning process prior to the selectively depositing of the $TiSi_2$ film.

17. The method of claim 16, where the selectively depositing the $TiSi_2$ film comprises exposing the substrate to a process gas containing a titanium-containing precursor gas and a silicon-containing precursor gas.

18. The method of claim 16, wherein the cleaning process comprises exposing the source/drain contact to a thermal H2 gas at a gas pressure between about 100 mTorr and about 700 mTorr, at a substrate temperature between about 600° C. and about 800° C., for a time period between about 10 sec and about 60 sec.

19. The method of claim 16, wherein the cleaning process comprises exposing the source/drain contact to a thermal NH3 and HF gas at a gas pressure between about 1 Torr and about 3 Torr, at a substrate temperature between about 35° C. and about 100° C., for a time period between about 10 sec and about 60 sec.

20. The method of claim 16, wherein the cleaning process comprises exposing the source/drain contact to a thermal NF3 and H2 gas at a gas pressure between about 1 Torr and about 3 Torr, at a substrate temperature between about 20° C. and about 100° C., for a time period between about 10 sec and about 60 sec.

* * * * *